United States Patent [19]

Hayden et al.

[11] Patent Number: 5,198,375
[45] Date of Patent: Mar. 30, 1993

[54] METHOD FOR FORMING A BIPOLAR TRANSISTOR STRUCTURE

[75] Inventors: James D. Hayden; Carlos A. Mazuré; Jon T. Fitch, all of Austin, Tex.

[73] Assignee: Motorola Inc., Schaumburg, Ill.

[21] Appl. No.: 856,314

[22] Filed: Mar. 23, 1992

[51] Int. Cl.⁵ .......................................... H01L 21/265
[52] U.S. Cl. ...................................... 437/31; 437/89; 437/59; 437/162; 148/DIG. 11
[58] Field of Search ...................... 437/89, 90, 91, 31, 437/162, 59; 148/DIG. 11

[56] References Cited

U.S. PATENT DOCUMENTS

| | | | |
|---|---|---|---|
| 4,663,831 | 5/1987 | Birrittella et al. | 148/DIG. 11 |
| 4,696,097 | 9/1987 | McLaughlin et al. | 437/193 |
| 4,703,554 | 11/1987 | Havemann | 437/31 |
| 4,786,615 | 11/1988 | Liaw et al. | 437/90 |
| 4,824,799 | 4/1989 | Komatsu | 437/162 |
| 4,849,371 | 7/1989 | Hansen et al. | 437/89 |
| 4,851,362 | 7/1989 | Suzuki | 437/162 |
| 4,860,077 | 8/1989 | Reuss et al. | 357/34 |
| 4,876,212 | 10/1989 | Koury | 437/34 |
| 4,902,641 | 2/1990 | Koury, Jr. | 437/90 |
| 4,997,775 | 3/1991 | Cook et al. | 437/31 |

Primary Examiner—Brian E. Hearn
Assistant Examiner—Tuan Nguyen
Attorney, Agent, or Firm—Robert L. King

[57] ABSTRACT

A vertical bipolar transistor (10) and a lateral bipolar transistor (11) are formed wherein both transistors (10 and 11) have a substrate (12). A dielectric layer (22) is formed overlying the substrate (12), and a conductive layer (24) is formed overlying the dielectric layer (22). Another dielectric layer (26) is formed overlying the conductive layer (24). A device opening is formed through the dielectric layers (22 and 26) and the conductive layer (24). A conductive region (33) is formed within the device opening and overlying the substrate (12). For transistor (10), the conductive region (33) is doped to form an active base electrode region (36) and a first current electrode region (38). A second current electrode region is formed via a diffusion (16). For transistor (11), a base electrode is formed via a diffused base region (46), and first and second current electrodes are respectively formed via diffused regions (44 and 48).

17 Claims, 3 Drawing Sheets

METHOD FOR FORMING A BIPOLAR TRANSISTOR STRUCTURE

CROSS REFERENCE TO RELATED APPLICATION

Related subject matter may be found in a copending U.S. patent application Ser. No. 07/844,037, filed on Mar. 2, 1992, entitled "A Transistor Useful for Further Vertical Integration and Method Of Formation" and assigned to the assignee hereof. (pending)

FIELD OF THE INVENTION

The present invention relates generally to semiconductor technology, and more particularly, to bipolar junction transistors.

BACKGROUND OF THE INVENTION

Planar bipolar junction transistors (BJTs) are often used to fabricate integrated circuits. A planar BJT has an emitter electrode, a base electrode, and a collector electrode which are formed usually by diffusion or ion implantation technology and are not self-aligned. Planar BJTs, although used and useful in many integrated circuit applications, consume a large amount of substrate area per transistor and have high parasitic resistance and high parasitic capacitance. In addition, with integrated circuit geometries decreasing into sub-micron ranges, planar diffused BJTs have various disadvantages. Due to smaller geometries and heat cycles, well documented problems such as increased leakage currents, device isolation breakdown, deep diffusion junction depths, and unwanted dopant outdiffusion are major problems. In addition, a high series resistance may result in diffused BJTs and degrade both amplification and switching speed performance. Diffused BJTs are also difficult to scale, and diffusion wells are difficult to position and process consistently with respect to one another. The scaling, positioning, and processing problems result in devices that vary greatly in performance across a wafer. Furthermore, the diffused BJT typically has a current carrying capability that is not as high as desired.

In order to increase amplification and improve upon the scaling problem, BJTs are formed with an emitter electrode which is doped via an overlying polysilicon layer. Doping via an overlying polysilicon layer allows diffusion junctions to be relatively shallow. Although this single-polysilicon BJT process results in improved performance over the diffused BJT, the single-polysilicon BJT has several of the diffused BJT disadvantages. Some examples of known disadvantages include deep diffusions for the base and collector and a high series resistance.

To improve upon the single-polysilicon BJT, a double-polysilicon BJT is used. The double-polysilicon BJT uses a first layer of polysilicon for forming a base electrode and a second layer of polysilicon for forming an emitter electrode. Performance improves for the double-polysilicon BJT when compared to the single-polysilicon BJT. Due to a presence of exposed silicon regions, etch processing of the double-polysilicon BJT result in substrate trenching which leads to etch damage. This etch damage may result in increased leakage current and may increase series resistance. Furthermore, a physically large base region results which creates larger capacitance and therefore slows the operation of the double-polysilicon BJT.

A sidewall base contact structure (SICOS) BJT is used to improve performance. A very complicated process is required to form a conventional SICOS contact. A base is formed as a mesa by silicon etching, and the silicon etching may introduce silicon damage into the base region. A SICOS contact is formed by a complex photoresist etch-back scheme. The SICOS structure may be used to form both NPN or PNP bipolar transistors. In some cases, undesirable parasitics of NPN and PNP bipolar transistors are increased.

SUMMARY OF THE INVENTION

The previously mentioned disadvantages are overcome and other advantages achieved with the present invention. In one form, the present invention comprises a bipolar transistor and a method for forming the bipolar transistor. The bipolar transistor has a base layer wherein the base layer has a surface. A first dielectric layer is formed overlying the base layer, and a conductive layer is formed overlying the first dielectric layer. A second dielectric layer is formed overlying the conductive layer. Portions of each of the first dielectric layer, the conductive layer, and the second dielectric layer are removed to form both a device opening which exposes the surface of the substrate and a sidewall of the conductive layer. A conductive region is formed within said device opening. The conductive region is doped to form an emitter electrode, a base electrode, and a collector electrode. The conductive layer is used to form a portion of either said base electrode or said collector electrode and emitter electrode by thermally driving dopant atoms from the conductive layer into the conductive region.

The present invention will be more clearly understood from the detailed description below in conjunction with the accompanying drawings.

DESCRIPTION OF THE PREFERRED EMBODIMENT

Figure 1:
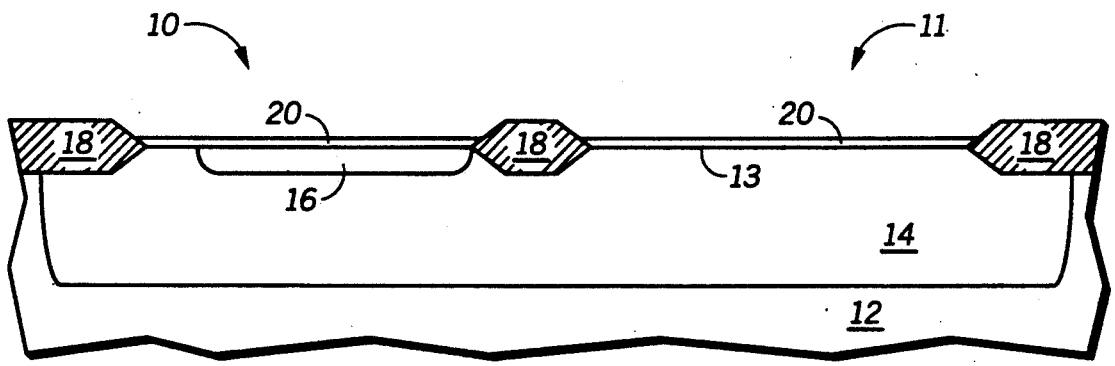
FIGS. 1-8 illustrate, in cross-sectional form, a method used to form a vertical bipolar transistor and a lateral bipolar transistor in accordance with the present invention.

Illustrated in FIG. 1 is a structure suitable for formation of a vertical bipolar transistor 10 and a lateral bipolar transistor 11. In many cases, the formation of transistor 10 is similar to the formation of transistor 11. Therefore, various process flow steps described herein are discussed with reference to a single transistor. The transistors 10 and 11 have a base layer or substrate 12 which has a surface 13. The substrate is of a first conductivity type wherein a conductivity type is either N type or P type. In some cases, the transistor 10 or the transistor 11 may be formed overlying another device or structure. In this case, the base layer is a conductive region, electrode, or conductive layer of the underlying device or structure. Substrate 12 or the base layer may be made of silicon, gallium arsenide, silicon on sapphire, epitaxial formations, germanium, germanium silicon, and/or like substrate materials. If substrate 12 is used as the base layer, the substrate 12 is preferably made of silicon.

A doped diffused well 14 is formed within the substrate 12 and exposed at the surface 13 of the substrate 12. The well 14 is of a second conductivity type wherein the second conductivity type is opposite the first conductivity type. A diffusion 16 is formed within the well 14 as explained below. The diffusion 16 is of the first conductivity type. A field dielectric layer 18 is formed adjacent active areas. Active areas are regions of either substrate 12, well 14, or diffusion 16 which are used for the formation of active devices, such as transistors 10 and 11. A screen dielectric layer 20 is used for active area protection, improved diffusion formation, and other conventional purposes. The dielectric layer 20 may be removed subsequent to diffusion formation as illustrated in FIG. 2 or may remain on the surface of the substrate 12.

Figure 2:
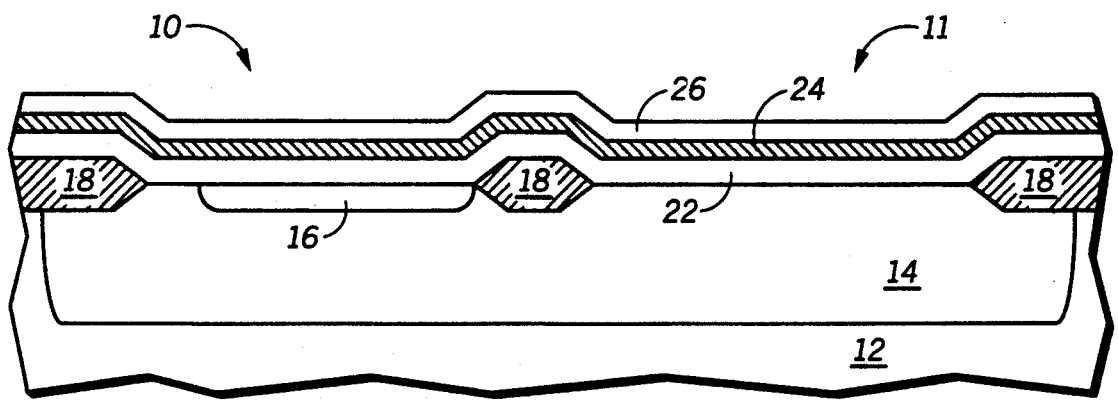

In FIG. 2, a first dielectric layer 22 is formed overlying substrate 12 and initially overlying the diffusion 16. A conductive layer 24 is formed overlying the dielectric layer 22. In a preferred form, conductive layer 24 is polysilicon, but conductive layer 24 may be a metal, a salicide or silicide, germanium silicon, or the like. A second dielectric layer 26 is formed overlying the conductive layer 24.

The dielectric layers 22 and 26, and all other dielectrics described herein may vary in physical and chemical composition based upon the function they perform. The dielectric layers described herein may be wet or dry silicon dioxide ($SiO_2$), nitride, tetra-ethyl-ortho-silicate (TEOS) based oxides, boro-phosphate-silicate-glass (BPSG), phosphate-silicate-glass (PSG), boro-silicate-glass (BSG), oxide-nitride-oxide (ONO), tantalum pentoxide ($Ta_2O_5$), plasma enhanced silicon nitride (P-$SiN_x$) and/or the like. If doped glasses, such as BPSG and PSG, are formed adjacent or overlying active areas, the doped glass may be used as a dopant source. If a doped glass dopant source is undesirable, BPSG or PSG should be shielded by an undoped glass or should not be formed adjacent active areas. Specific dielectrics are noted herein if a specific dielectric is preferred or required.

Figure 3:
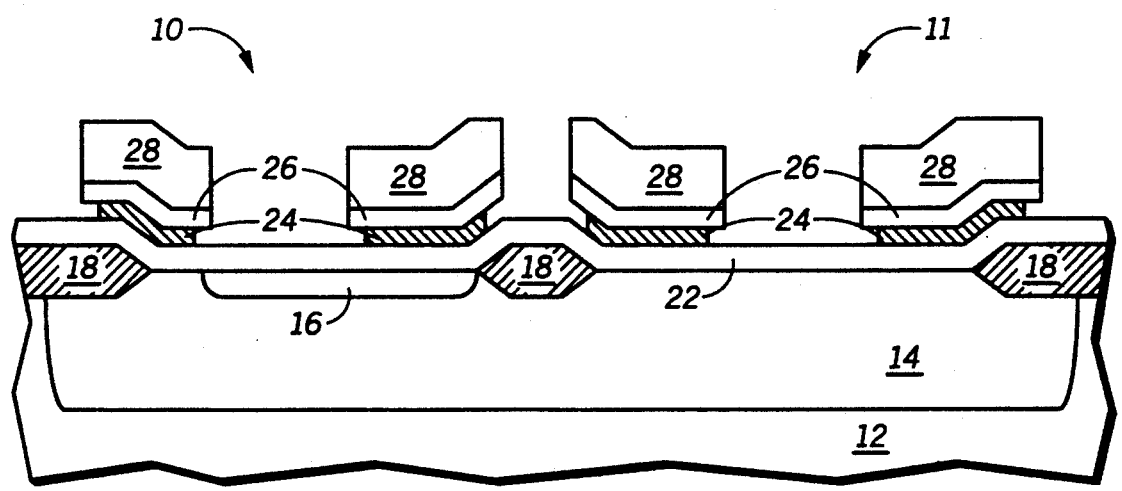

In FIG. 3, a masking layer 28, which is preferably a layer of photoresist, is deposited overlying the dielectric layer 26. The masking layer 28 is conventionally patterned and etched to form a mask opening for each of the transistors 10 and 11. The mask openings expose portions of the dielectric layer 26. The exposed portions of the dielectric layer 26 are etched selective to the conductive layer 24 to form openings in the dielectric layer 26. Portions of the conductive layer 24 are etched selective to the dielectric layer 22 to deepen the openings by etching into the conductive layer 24. The etching of the conductive layer 24 forms a sidewall of the conductive layer 24 for each of the transistors 10 and 11. All of the openings are self-aligned to each other due to the masking layer 28.

In a preferred form, the sidewalls of the conductive layer 24 are over-etched to laterally recess the sidewalls of the conductive layer 24 as illustrated in FIG. 3. Isotropic etching is usually used to accomplish the lateral recession of the sidewalls. The recession of the sidewalls of the conductive layer 24 has advantages that are described herein. It is important to note that the recession of the sidewalls of the conductive layer 24 is optional.

Figure 4:
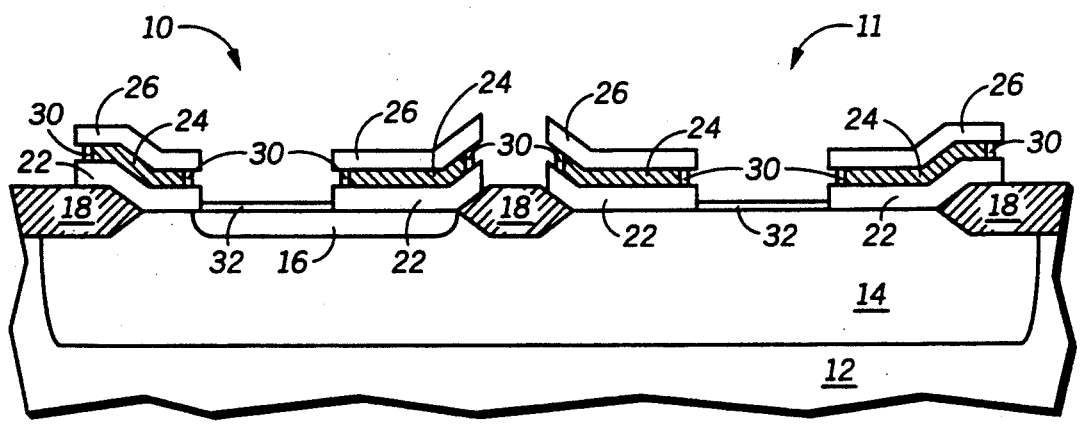

In FIG. 4, portions of the dielectric layer 22 are etched selective to substrate 12 to further deepen the opening by etching into the dielectric layer 22. The etching of the dielectric layer 22 exposes the surface of the diffusion 16 for transistor 10 and exposes a surface of the well 14 for transistor 11. The etching of the dielectric layers 22 and 26 and conductive layer 24 results in an opening for each of the transistors 10 and 11 that is self-aligned to the mask openings. The openings are referred to as device openings in most cases. It should be apparent that non-selective etching through the dielectric layer 26 and the conductive layer 24 may be used to form the device openings. The device openings can be of any geometry or size but are each preferably a contact hole of minimum lithographic size. After the device openings are formed, the masking layer 28 is removed.

It is important to note that the diffusion 16 is formed in one of at least two ways. In one form, the diffusion 16 can be implanted or diffused into the substrate 12 selectively through the use of one of a photoresist mask, an oxide mask, a nitride mask or the like. Diffusion 16 may be implanted through an oxide, such as dielectric layer 20 or a like material, to ensure a shallow, dopant-dispersed diffusion junction. This implantation or diffusion occurs before the formation of the conductive layer 24. In a second method, the diffusion 16 can be implanted or diffused after the formation of the device opening. The second method, when using ion implantation, is usually preferred due to the fact that the resulting diffusion 16 is self-aligned to the device openings of transistor 10 and 11.

FIG. 4 also illustrates a sidewall dielectric layer formation step. A sidewall dielectric layer 30 is formed on the sidewalls of the conductive layer 24 that resulted from the formation of the device openings. The dielectric layer 30 is preferably a grown $SiO_2$ layer. The growth of dielectric layer 30 will result in a thin dielectric layer 32 being grown on an exposed surface of the diffusion 16 for transistor 10 and on an exposed surface of the well 14 for transistor 11. In another form, the dielectric layer 30 could be formed via deposition technology or spacer formation technology.

Figure 5:
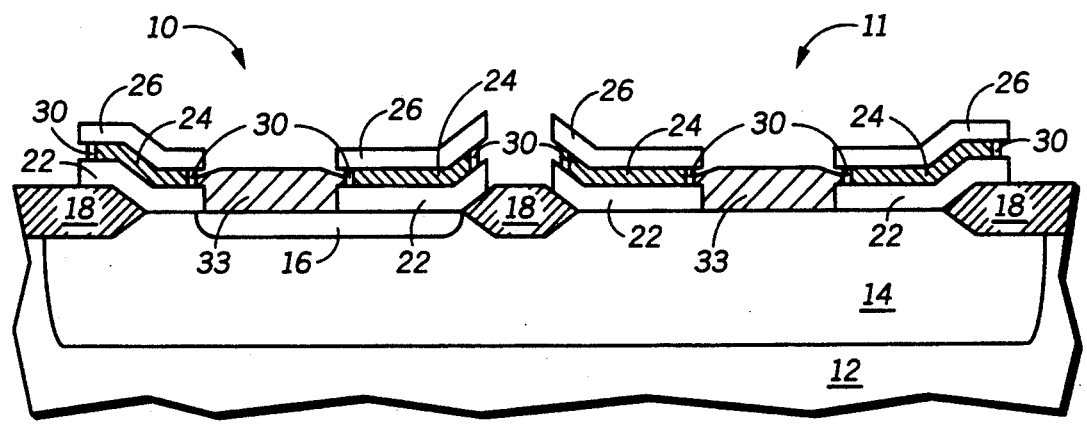

The formation of the dielectric layer 32 is a side-effect that is undesirable. Therefore, FIG. 5 illustrates a dielectric removal step for the dielectric layer 32 along with an epitaxial growth step. A reactive ion etch (RIE) step is used to remove the dielectric layer 32 from the surface of the substrate 12. Due to the fact that the sidewall dielectric layer 30 is formed on a recessed sidewall of the conductive layer 24, the RIE etch does not remove the sidewall dielectric layer 30.

Once the dielectric layer 32 is removed, FIG. 5 illustrates formation of a portion of a conductive region within each of the device openings. In a preferred form, a grown conductive region 33 is used to form all of the electrodes of the transistors 10 and 11. Preferably, the conductive region 33 is formed via epitaxial growth and is in-situ doped or implanted with dopants to form the conductive region 33 of the first conductivity type. It is important for electrical connection of the transistor 10 that the conductivity type of the conductive region 33 matches the conductivity type of the diffusion 16.

To form the conductive region 33, the transistors 10 and 11 are placed into conventional and commercially available equipment suitable for epitaxial growth. Growth is initiated by heating transistors 10 and 11 and subjecting exposed portions of the substrate 12 or diffusion 16 to a chemical compound such as dichloro-silane or a similar silicon source gas. It is important to note that epitaxial growth requires a clean surface. Therefore, before initiating growth a cleaning cycle, such as a conventional RCA oxidizing clean, an Ishizaka-Shiraki clean, or an equivalent cleaning cycle, is performed.

Figure 6:
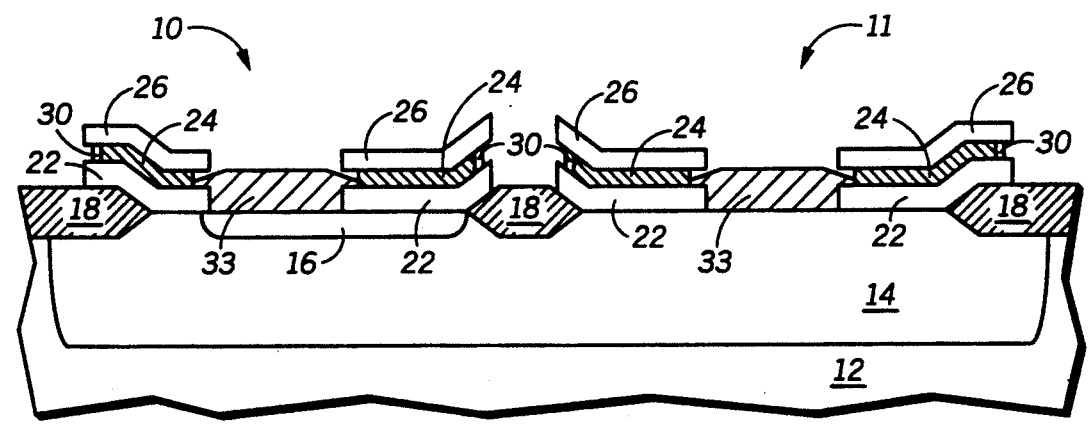

In FIG. 6, the sidewall dielectric layer 30 is removed from the device opening of each of transistors 10 and 11. Dielectric layer 30 is removed preferably by an isotropic etch step. Once the dielectric layer 30 is removed a brief epitaxial growth step is used to connect the conductive layer 24 to the conductive region 33 for each of the transistors 10 and 11. During epitaxial growth, polysilicon grows from polysilicon and single-crystalline silicon grows from single-crystalline silicon. Epitaxial material may also form over metals and silicide. Therefore, the conductive layer 24 and conductive region 33 will grow towards each other and connect physically. It should be noted that conductive spacers (not illustrated) may be used to form electrical contact between the conductive layer 24 and the conductive region 33. The conductive spacers (not illustrated) must be subsequently isolated by a dielectric spacer (not illustrated) or the like.

Figure 7:
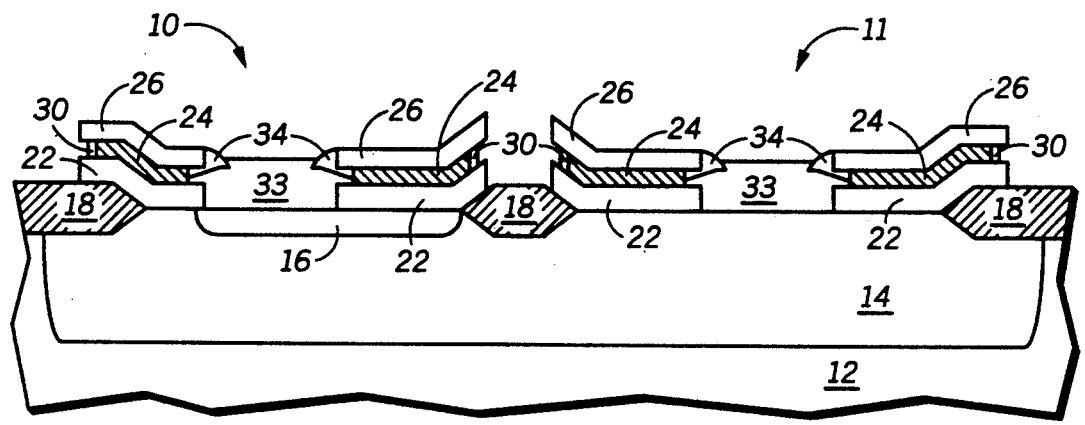

After electrical connection of the conductive layer 24 to the conductive region 33, a spacer 34 is formed as illustrated in FIG. 7. Spacer 34 serves two primary functions and is preferably nitride. One function is that spacer 34 covers all exposed surfaces of conductive layer 24 to prevent conductive layer 24 from undergoing subsequent polysilicon growth during epitaxial processing steps. A second function is that the spacer can prevent electrodes from electrically short circuiting, in some cases. Active areas or electrodes, such as base electrodes, emitter electrodes, and control electrodes, containing or made of polysilicon are usually of poor quality when compared to single-crystalline or epitaxial silicon electrodes. Therefore, spacer 34 ensures that no polysilicon will epitaxially contribute to subsequent epitaxial electrode processing. It should be apparent that the spacer 34 is optional and not always necessary. If the conductive layer 24 is recessed significantly, as described herein, or if the sidewall dielectric layer 30 is made significantly thick, epitaxial growth of the conductive region 33 may connect to and pinch-off conductive layer 24 before the polysilicon of conductive layer 24 can epitaxially grow into the device opening. No spacer 34 is needed if pinch-off occurs.

In FIG. 7, epitaxial growth continues to extend the conductive region 33 vertically between the spacer 34. This extension step is optional and is used to form a more planar topography.

Figure 8:
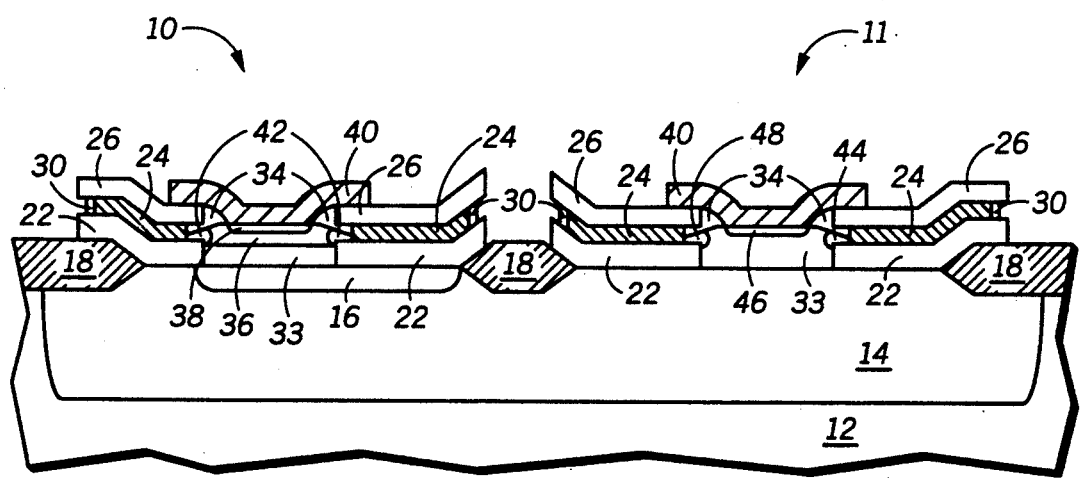

In FIGS. 1–7, the process flow for the transistors 10 and 11 is nearly identical with the exception of the diffusion 16. In FIG. 8, the processing for each of the transistors 10 and 11 varies. For this reason, transistor 10 is discussed first and transistor 11 is discussed in later paragraphs. Conventional masking techniques can be used to adequately protect transistor 10 when transistor 11 is being processed and vice versa.

Transistor 10 of FIG. 8 is implanted, dopant diffused, or insitu doped during prior growth to form an active base electrode region 36 from an upper portion of region 33. Region 36 is doped with dopant atoms of the second conductivity type. A diffused region 42 is formed adjacent the region 36 and is the same conductivity as the region 36. Region 42 is formed by thermally driving dopant atoms of the second conductivity type from the conductive layer 24 into the region 36. Region 42 may be two separated diffusions if conductive layer 24 is split into two electrically isolated regions by the formation of the device opening. In another embodiment, the diffused region 42 may completely surround the region 36 in a cylindrical diffused fashion if conductive layer 24 completely surrounds the device opening.

A conductive layer 40 is formed overlying the region 36. Conductive layer 40 is doped with dopant atoms that are of the first conductivity type. Dopant atoms are thermally driven from the conductive layer 40 to form a current electrode region 38. As used herein, a current electrode is either an emitter electrode or a collector electrode.

In general, region 36 and region 42 form a base electrode, and conductive layer 24 forms a base electrode contact for transistor 10. Diffusion 16, and a remaining portion of region 33 form either an emitter electrode or a collector electrode and a first current electrode electrical contact to the transistor 10. The conductive layer 40 and the region 38 form either an emitter electrode or a collector electrode and a second current electrode electrical contact to the transistor 10. Usually, doping concentration and geometry determines which regions function as a collector electrode and which regions function as an emitter electrode. The emitter electrode is doped with more dopant atoms than the collector electrode for optimal bipolar transistor operation. It is important to note that dopant atoms can thermally move between the diffusion 16 and the conductive region 33 to form other doped regions or diffusions.

For transistor 11, region 33 functions as a base region of the first conductivity type. A conductive layer 40 is formed overlying the region 33. Dopant atoms are thermally driven from the conductive layer 40 or dopant atoms are implanted to form a diffused base region 46. Together, regions 33 and 46 and conductive layer 40 function as a base electrode and base electrical contact. For transistor 10, the conductive layer 24 is separated or etched into two conductive electrically isolated regions via the formation of the device opening. Therefore, a diffused region 44 and a diffused region 48 are thermally formed from the two electrically separated regions of conductive layer 24. The diffused region 44 and the diffused region 48 are electrically isolated from each other. The diffused region 44 along with a connection to the conductive layer 24 form either an emitter electrode or a collector electrode with an electrical connection. The diffused region 48 along with a connection to the conductive layer 24 form either an emitter electrode or a collector electrode with an electrical connection. One emitter electrode and one collector electrode is required. The emitter electrode is in most cases doped heavier than the collector electrode.

Both lateral NPN and PNP transistors can be formed, and both vertical NPN and PNP transistors may be formed by the inventive transistors described herein.

The inventive method presented herein provides for either the independent formation or the simultaneous formation of lateral and/or vertical bipolar transistors. BiCMOS and bipolar circuits which have reduced substrate surface area, reduced leakage currents, and reduced capacitive parasitics will result via the transistors disclosed herein. Due to the fact that an electrode or base length of the transistor 10 is controlled by a region 36 thickness, many transistor electrode and base geometries will be independent from lithography, smaller than lithography allows, and controlled within a smaller variation. The effective base area of the transistors 10 and 11 and current paths may be reduced in area as compared with conventional bipolar transistors. Smaller base areas in the inventive transistors improve frequency response without increasing the complexity of the transistor processing. Base resistance is decreased due to the geometry of the base contact. Silicon etch damage is limited due to the fact that subtractive techniques, such as silicon etching, are avoided. Base doping can be independently optimized to improve current drive. Greater isolation to the substrate is achieved.

The transistors 10 and 11 are formed within a contact which is lithographically the smallest feature size in an integrated circuit. In addition, the formation of the inventive transistor requires few photolithography steps, and many features of the transistors 10 and 11 can be self-aligned. Asymmetric electrodes may be formed and asymmetrical electrodes allow for greater circuit design flexibility than conventional bipolar transistors.

While the present invention has been illustrated and described with reference to specific embodiments, further modifications and improvements will occur to those skilled in the art. For example, epitaxial growth methods vary in temperature, doping mechanisms, length of time, procedures, and chemistry, and most of these epitaxial processes are capable of forming the electrodes and regions of the inventive transistors and devices. Many applications exist for the inventive transistors and inventive structures. Many cleaning cycles exist for epitaxial growth procedures. Sidewall dielectrics may be used in one of several ways and may even be used as sidewall gate dielectrics in BiCMOS processing and for transistor protection and isolation. Although sidewall dielectric formation is presented herein as a sidewall oxidation step, sidewall spacers may be used for sidewall dielectric formation or electrode formation. Several methods may be used for forming output conductor connections to electrodes, such as sidewall contacts and epitaxial formed connections. There are many ways in which to form the electrodes described herein, such as in-situ doping, ion implantation, thermal dopant diffusion, and the like. It is to be understood, therefore, that this invention is not limited to the particular forms illustrated and that it is intended in the appended claims to cover all modifications that do not depart from the spirit and scope of this invention.

We claim:

1. A method for forming a bipolar transistor comprising the steps of:
   providing a base layer having a surface;
   forming a first dielectric layer overlying the base layer;
   forming a conductive layer overlying the first dielectric layer;
   forming a second dielectric layer overlying the conductive layer;
   removing portions of each of the first dielectric layer, the conductive layer, and the second dielectric layer to form both a device opening which exposes the surface of the base layer and a sidewall of the conductive layer;
   forming a sidewall dielectric layer adjacent the sidewall of the conductive layer;
   forming a conductive region within said device opening, the conductive region being doped to form a base electrode, an emitter electrode, and a collector electrode, said conductive layer being electrically coupled to at least one of a portion of the base electrode, a portion of the emitter electrode, or a portion of the collector electrode;
   removing the sidewall dielectric layer;
   forming a sidewall spacer overlying the conductive region; and
   forming an interconnecting layer of conductive material overlying the sidewall spacer, the interconnecting layer being electrically coupled to the conductive region.

2. The method of claim 1 wherein the step of forming the sidewall spacer further comprises the step of:
   forming the sidewall spacer as a dielectric material wherein the sidewall spacer is laterally adjacent a portion of said device opening.

3. The method of claim 1 wherein the step of forming the conductive region further comprises the step of:
   forming said conductive region as an epitaxial region.

4. The method of claim 3 wherein the step of forming the conductive region further comprises the step of:
   using in-situ doping to electrically dope one of said base electrode, said collector electrode, or said emitter electrode.

5. The method of claim 1 wherein the step of removing portions further comprises the step of:
   using a non-selective etch to remove portions of the second dielectric layer and the conductive layer.

6. The method of claim 1 further comprising the steps of:
   forming a sidewall dielectric laterally adjacent said sidewall of the conductive layer;
   removing a portion of the sidewall dielectric to expose a portion of the conductive layer; and
   forming an electrical connection between the conductive region and the conductive layer.

7. The method of claim 1 wherein the step of removing portions further comprises the step of:
   etching the sidewall of the conductive layer to laterally recess the sidewall of the conductive layer before forming the sidewall dielectric.

8. The method of claim 1 wherein the step of removing portions further comprises the steps of:
   forming a masking layer overlying the second dielectric layer, the masking layer having a mask opening;
   etching a portion of the second dielectric layer which is exposed by the mask opening to form a first portion of the device opening in the second dielectric layer which is self-aligned to the mask opening and to expose a portion of the conductive layer;
   etching the exposed portion of the conductive layer to form a second portion of the device opening in the conductive layer which is self-aligned to the first portion of the device opening in the second dielectric layer and exposes a portion of the first dielectric layer; and
   etching the exposed portion of the first dielectric layer to form a third portion of the device opening in the first dielectric layer which is self-aligned to the second portion of the device opening in the conductive layer and exposes the surface of the substrate.

9. The method of claim 1 comprising the step of:
   electrically connecting the conductive layer to the conductive region by growing epitaxial material to connect the conductive layer and the conductive region.

10. A method for forming a bipolar transistor comprising the steps of:
    providing a silicon substrate having a surface;
    forming a diffused region within the silicon substrate and exposed at the surface of the silicon substrate;
    forming a first dielectric layer overlying the silicon substrate;

depositing a polysilicon conductive layer overlying the first dielectric layer;

depositing a second dielectric layer overlying the polysilicon conductive layer;

etching portions of each of the first dielectric layer, the polysilicon conductive layer, and the second dielectric layer to form both a device opening which exposes the surface of the diffused region and a sidewall of the polysilicon conductive layer;

forming a sidewall dielectric layer adjacent the sidewall of the polysilicon conductive layer;

growing an epitaxial region within said device opening, the epitaxial region being doped to form an emitter electrode, a base electrode, and a collector electrode;

removing the sidewall dielectric layer; and electrically connecting the polysilicon conductive layer to at least one of said collector electrode, said base electrode, and said emitter electrode by thermally driving dopant atoms from the polysilicon conductive layer into the epitaxial region.

11. The method of claim 10 further comprising the steps of:

forming a sidewall oxide laterally adjacent said sidewall of the polysilicon conductive layer before formation of the epitaxial region;

removing the sidewall oxide after the formation of a portion of the epitaxial region; and forming an electrical connection between the epitaxial region and the polysilicon conductive layer.

12. The method of claim 10 wherein the step of etching portions further comprises the step of:

etching the sidewall of the polysilicon conductive layer to laterally recess the sidewall of the polysilicon conductive layer before forming a sidewall oxide adjacent the sidewall of the polysilicon conductive layer.

13. The method of claim 10 wherein the step of growing the epitaxial region further comprises the step of:

using in-situ doping to electrically dope one of said base electrode, said collector electrode or said emitter electrode.

14. A method for forming a bipolar transistor comprising the steps of:

providing a silicon substrate having a surface;

forming a diffused region within the silicon substrate and exposed at the surface of the silicon substrate;

forming a first dielectric layer overlying the silicon substrate;

depositing a polysilicon conductive layer overlying the first dielectric layer;

depositing a second dielectric layer overlying the polysilicon conductive layer;

etching portions of each of the first dielectric layer, the polysilicon conductive layer, and the second dielectric layer to form both a device opening which exposes the surface of the diffused region and a sidewall of the polysilicon conductive layer;

forming a sidewall dielectric layer adjacent the sidewall of the polysilicon conductive layer;

growing an epitaxial region within said device opening, the epitaxial region being doped to form an emitter electrode, a base electrode, and a collector electrode;

removing said sidewall dielectric layer;

forming an electrical connection to said base electrode by thermally driving dopant atoms from the polysilicon conductive layer into the epitaxial region; and forming a dielectric spacer laterally adjacent a portion of said device opening.

15. The method of claim 14 further comprising the steps of:

forming a sidewall oxide laterally adjacent said sidewall of the polysilicon conductive layer before formation of the epitaxial region;

removing a portion of the sidewall oxide after the formation of a portion of the epitaxial region; and forming an electrical connection between the epitaxial region and the polysilicon conductive region.

16. The method of claim 15 wherein the step of etching portions further comprises the step of:

etching the sidewall of the polysilicon conductive layer to laterally recess the sidewall of the polysilicon conductive layer before forming the sidewall oxide.

17. The method of claim 14 wherein the step of growing the epitaxial region further comprises the step of:

using in-situ doping to electrically dope one of said base electrode, said collector electrode or said emitter electrode.

* * * * *